(12) United States Patent
Saiho

(10) Patent No.: US 8,344,432 B2
(45) Date of Patent: Jan. 1, 2013

(54) SOLID STATE IMAGING DEVICE AND IMAGING APPARATUS

(75) Inventor: Fuminobu Saiho, Fukuoka (JP)

(73) Assignee: Sony Corporation, Tokyo (JP)

( * ) Notice: Subject to any disclaimer, the term of this patent is extended or adjusted under 35 U.S.C. 154(b) by 193 days.

(21) Appl. No.: 12/763,295

(22) Filed: Apr. 20, 2010

(65) Prior Publication Data

US 2010/0282944 A1 Nov. 11, 2010

(30) Foreign Application Priority Data

May 11, 2009 (JP) ................................ 2009-114804

(51) Int. Cl.
 *H01L 31/062* (2012.01)

(52) U.S. Cl. ........ 257/294; 257/222; 257/225; 257/291; 257/E31.073; 257/E31.079; 257/E31.082

(58) Field of Classification Search .................. 257/222, 257/225, 290–294, E31.073, E31.078, E31.079, 257/E31.081, E31.082
See application file for complete search history.

(56) References Cited

U.S. PATENT DOCUMENTS 6,507,504 B2 * 1/2003 Nishikawa ................. 363/21.15
7,592,578 B2 * 9/2009 Shimotsusa et al. ....... 250/208.1

FOREIGN PATENT DOCUMENTS

JP 7-87244 9/1995
JP 2606001 2/1997

* cited by examiner

*Primary Examiner* — Matthew E Warren
(74) *Attorney, Agent, or Firm* — SNR Denton US LLP

(57) ABSTRACT

A solid state imaging device includes: a light receiving section performing photoelectric conversion; a transfer register formed in a semiconductor base; a transfer electrode formed of a semiconductor layer on the transfer register; a charge transfer section which formed of the transfer register and the transfer electrode and transferring a signal charge accumulated in the light receiving section; a bus line electrically connected to a portion of the transfer electrode to supply a driving pulse to the transfer electrode and formed of a metal layer; and a barrier metal layer formed near an interface between the transfer electrode and the bus line in a contact section that connects the transfer electrode and the bus line with each other and having a work function of the size between a work function of the semiconductor layer of the transfer electrode and a work function of the metal layer of the bus line.

7 Claims, 6 Drawing Sheets

Related Art

SOLID STATE IMAGING DEVICE AND IMAGING APPARATUS

BACKGROUND OF THE INVENTION

1. Field of the Invention

The present invention relates to a solid state imaging device with a charge transfer section, such as a CCD, and an imaging apparatus including a solid state imaging device.

2. Description of the Related Art

In a known CCD solid state imaging device, each horizontal transfer electrode extends to the outside of the channel region of a horizontal CCD register and is connected to a bus line by a contact in the outside of the channel region.

Generally, the bus line is formed of metal, such as aluminum.

In addition, in the recent CCD solid state imaging device, a configuration is proposed in which a horizontal transfer electrode is formed of a polycrystalline silicon layer of a single layer.

FIG. 10 shows an enlarged plan view near a horizontal transfer register of the CCD solid state imaging device in which the horizontal transfer electrode is formed of the polycrystalline silicon layer of a single layer. In addition, FIG. 11 is a cross-sectional view taken along the line X-X' of FIG. 10.

As shown in FIGS. 10 and 11, a horizontal transfer register 63 is formed near a surface of a portion of a semiconductor substrate 61 other than an element separation layer 62. A horizontal transfer electrode 65 made of polycrystalline silicon is formed on the semiconductor substrate 61 with a gate insulating layer 64 interposed therebetween. To the horizontal transfer electrode 65, a horizontal transfer pulse $\phi$H1 of a first phase and a horizontal transfer pulse $\phi$H2 of a second phase are applied alternately.

In FIG. 10, a bus line 68 for supplying the horizontal transfer pulse $\phi$H2 of a second phase is disposed in a lower portion than the horizontal transfer register 63, and a bus line 67 for supplying the horizontal transfer pulse $\phi$H1 of a first phase is disposed in a lower portion than the bus line 68. The bus lines 67 and 68 are electrically connected to the horizontal transfer electrode 65 by a contact section 66.

On the horizontal transfer register 63, a light shielding layer 69 is formed so as to cover the horizontal transfer electrode 65.

In the configuration of the CCD solid state imaging device shown in FIGS. 10 and 11, it is necessary to provide a region only for connection between the horizontal transfer electrode 65 and the bus lines 67 and 68 outside the horizontal transfer register 63. This is disadvantageous in that the chip area increases.

In addition, due to extending the horizontal transfer electrode 65 to the region only for connection, the load capacitance between the horizontal transfer electrodes 65 or between the horizontal transfer electrode 65 and the light shielding layer 69 increases. As a result, the resistance from the horizontal transfer electrode 65 of a portion on the horizontal transfer register 63 to the bus lines 67 and 68 increases.

In this case, since the speed of a horizontal transfer driving pulse is decreased, an improvement of speed of horizontal charge transfer or a reduction in power consumption becomes difficult and this may lead to deterioration of horizontal transfer.

As a technique for solving these problems, there is a technique of performing connection between a horizontal transfer electrode and a bus line on a horizontal CCD register (see Japanese Patent No. 2606001 or JP-B-7-87244).

This is a technique of connecting the bus line formed of metal with the horizontal transfer electrode formed of polycrystalline silicon on a channel of the horizontal CCD register, that is, on an active region.

In such a technique, however, potential shift occurs because there is a large difference between the work functions of metal and polycrystalline silicon (see 'Kazuya Yonemoto, Hideshi Abe "Two-million pixel FIT-CCD image sensor for HDVT", The Institute of Electronic and Information Engineers of Japan, VLD90-22, ICD90-58, June 1990').

SUMMARY OF THE INVENTION

The occurrence of potential shift also causes deterioration of horizontal transfer, which is disadvantageous.

For this reason, it is necessary to connect a horizontal transfer electrode and a bus line so that the potential shift does not occur.

Therefore, in view of the above, it is desirable to provide a solid state imaging device capable of reducing the chip size and of performing transfer of a signal charge satisfactorily and an imaging apparatus including the solid state imaging device.

A solid state imaging device according to an embodiment of the present invention includes: a light receiving section which performs photoelectric conversion; a transfer register formed in a semiconductor base; and a transfer electrode which is formed of a semiconductor layer on the transfer register. Moreover, the solid state imaging device includes: a charge transfer section which is formed of the transfer register and the transfer electrode and which transfers a signal charge accumulated in the light receiving section; and a bus line which is electrically connected to a portion of the transfer electrode on the transfer register in order to supply a driving pulse to the transfer electrode and which is formed of a metal layer. Moreover, the solid state imaging device includes a barrier metal layer which is formed near an interface between the transfer electrode and the bus line in a contact section that connects the transfer electrode and the bus line with each other and which has a work function of the size between a work function of the semiconductor layer of the transfer electrode and a work function of the metal layer of the bus line.

An imaging apparatus according to another embodiment of the present invention includes: a condensing optical section which condenses incident light; a solid state imaging device which receives the incident light condensed in the condensing optical section and performs photoelectric conversion; and a signal processor which processes a signal obtained by the photoelectric conversion in the solid state imaging device. In addition, in the imaging apparatus according to the embodiment of the present invention, the above-described solid state imaging device is provided as a solid state imaging device.

In the configuration of the solid state imaging device according to the embodiment of the present invention, the bus line is electrically connected to a portion of the transfer electrode on the transfer register. In this case, the bus line is located on the transfer register. Accordingly, since it is not necessary to provide a region for connection between the transfer electrode and the bus line outside the transfer register, the chip size of the solid state imaging device can be reduced as much as the region. In addition, since it is not necessary to extend the transfer electrode to the outside of the transfer register, the load capacitance of the transfer electrode can be reduced.

Moreover, in the contact section that connects the transfer electrode and the bus line with each other, the barrier metal layer which has a work function of a size between a work function of the semiconductor layer of the transfer electrode and a work function of the metal layer of the bus line is formed near the interface between the transfer electrode and the bus line. Accordingly, even if a bus line is formed on the transfer register, the potential shift does not occur.

In the configuration of the imaging apparatus according to the embodiment of the present invention, the above-described solid state imaging device is provided as a solid state imaging device. Accordingly, it is possible to reduce the chip size of the solid state imaging device, and the potential shift does not occur.

According to the above-described embodiment of the present invention, since the chip size of the solid state imaging device can be reduced, it is possible to improve the yield. That is, it is possible to increase the number of chips of solid state imaging devices which can be acquired from one wafer.

In addition, since the load capacitance of the transfer electrode can be reduced, it is possible to increase the charge transfer speed or to reduce power consumption.

Moreover, according to the embodiment of the present invention, potential shift does not occur. Accordingly, since deterioration of transfer of a signal charge is prevented, the transfer of a signal charge can be satisfactorily performed. That is, the quality of an image obtained in the solid state imaging device can be improved.

In the imaging apparatus according to the embodiment of the present invention, the chip size of the solid state imaging device can be reduced. Accordingly, it is possible to make the imaging apparatus small.

In addition, since it is possible to increase the speed in charge transfer of the solid state imaging device, it becomes possible to increase the operation speed of the imaging apparatus or to reduce power consumption of the imaging apparatus.

In addition, since the transfer of a signal charge of the solid state imaging device is satisfactorily performed, the quality of an image obtained in the imaging apparatus can be improved.

DESCRIPTION OF THE PREFERRED EMBODIMENTS

Hereinafter, best modes (hereinafter, referred to as embodiments) for carrying out the present invention will be described.

Figure 1:
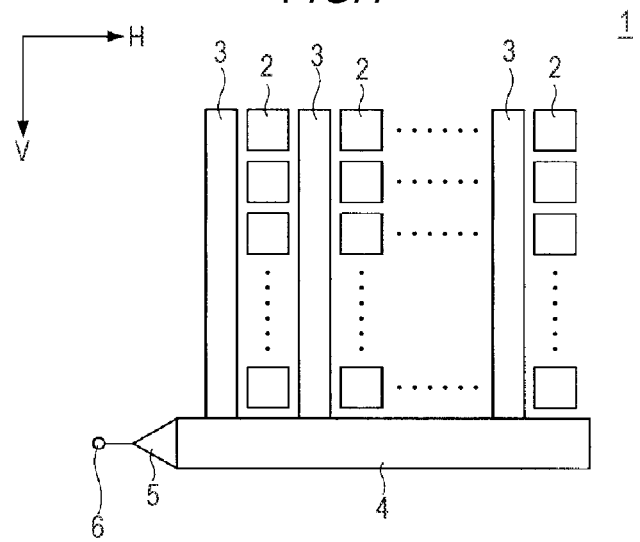
FIG. 1 is a view (plan view) showing the schematic configuration of a solid state imaging device according to a first embodiment of the present invention.

In addition, the explanation will be performed in following order.
1. First embodiment of a solid state imaging device
2. Second embodiment of a solid state imaging device
3. Third embodiment of a solid state imaging device
4. Fourth embodiment of a solid state imaging device
5. Modifications
6. Embodiment of an imaging apparatus 1. First Embodiment of a Solid State Imaging Device FIG. 1 is a view (plan view) showing the schematic configuration of a solid state imaging device according to a first embodiment of the present invention.

A CCD solid state imaging device is applied as the solid state imaging device according to the first embodiment of the present invention.

In a CCD solid state imaging device 1, a plurality of light receiving sections 2 which form pixels are arrayed in a matrix. For example, the light receiving section 2 is formed of a photodiode and performs photoelectric conversion.

A vertical transfer register 3 extending in a vertical direction V is disposed on the left side of the light receiving section 2 in each column. A horizontal transfer register 4 extending in a horizontal direction H is connected to one end (lower end) of the vertical transfer register 3. An output amplifier 5 and an output terminal 6 are connected to the left end of the horizontal transfer register 4.

In the CCD solid state imaging device 1, a signal charge read from each light receiving section 2 in each column is read to the corresponding vertical transfer register 3. Then, the signal charge is transferred in the vertical transfer register 3 so as to be transferred to the horizontal transfer register 4. Then, the signal charge is transferred in the horizontal transfer register 4 and is then converted into a voltage signal by the output amplifier 5 and output from the output terminal 6.

Figure 2:
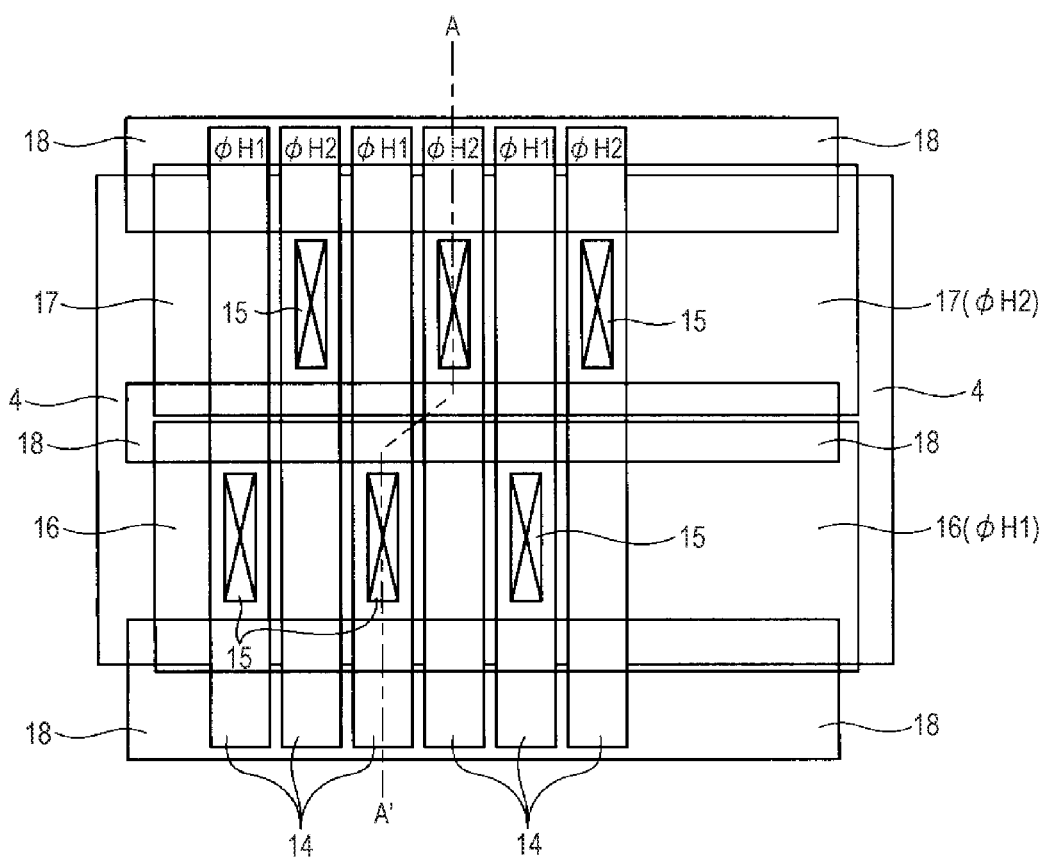
FIG. 2 is an enlarged plan view showing a horizontal transfer register and its neighborhood in the CCD solid state imaging device shown in FIG. 1.

Then, FIG. 2 is an enlarged plan view showing the horizontal transfer register 4 and its neighborhood in the CCD solid state imaging device 1 shown in FIG. 1. In addition, FIG. 3 is a cross-sectional view taken along the line A-A' of FIG. 2.

Figure 3:
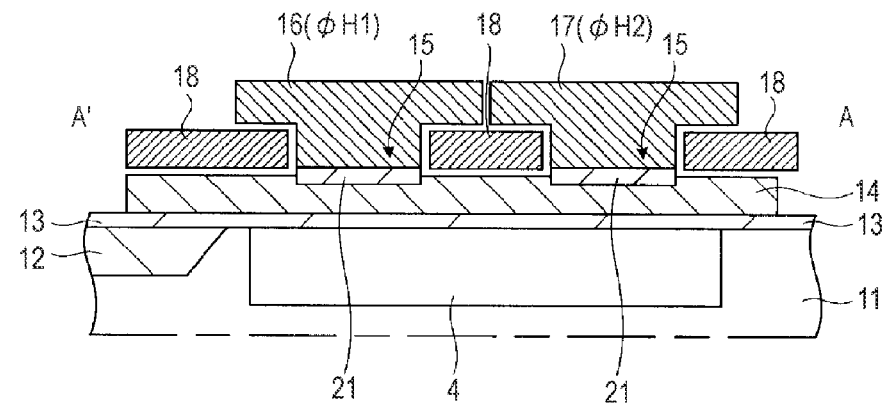
FIG. 3 is a cross-sectional view taken along the line A-A' of FIG. 2.

As shown in FIG. 3, the horizontal transfer register 4 is formed near a surface of a portion of a silicon substrate or a semiconductor base 11, which is formed of a silicon layer on the subject, other than an element separation layer 12. Specifically, the horizontal transfer register 4 is formed of a transfer channel region using an impurity region formed in the semiconductor base 11.

A horizontal transfer electrode 14 made of polycrystalline silicon is formed on the semiconductor base 11 with a gate insulating layer 13 interposed therebetween. Moreover, the horizontal transfer register 4 and the upper horizontal transfer electrode 14 provided on the horizontal transfer register 4 form a horizontal transfer section.

In addition, although not shown, the vertical transfer register 3 and a vertical transfer electrode of a vertical transfer section are provided on the right side of the horizontal transfer register 4 shown in FIG. 3. The vertical transfer register 3 and a photodiode of the light receiving section 1 are also formed in the semiconductor base 11.

As shown in FIG. 2, the horizontal transfer electrode 14 to which a horizontal transfer pulse φH1 of a first phase is applied and the horizontal transfer electrode 14 to which a horizontal transfer pulse φH2 of a second phase is applied are alternately arrayed as the horizontal transfer electrode 14. In addition, the horizontal transfer electrode 14 does not overlap the adjacent horizontal transfer electrode 14 and is formed as an electrode layer of a single layer.

In addition, a bus line 16 for supplying the horizontal transfer pulse φH1 of the first phase is electrically connected to the horizontal transfer electrode 14, to which the horizontal transfer pulse φH1 of the first phase is applied, by a contact section 15. A bus line 17 for supplying the horizontal transfer pulse φH2 of the second phase is electrically connected to the horizontal transfer electrode 14, to which the horizontal transfer pulse φH2 of the second phase is applied, by the contact section 15.

The bus lines 16 and 17 are formed of a metal wiring layer and formed to extend in a horizontal direction H so as to be parallel to the horizontal transfer register 4.

As a material of the metal wiring layer which forms the bus lines 16 and 17, aluminum, tungsten, or copper may be used, for example. In addition, other metal elements or an alloy may also be used for the bus lines 16 and 17.

In addition, the bus lines 16 and 17 and the contact section 15 are at the approximately same plane position as the horizontal transfer register 4 as shown in FIG. 2 and are disposed above the horizontal transfer register 4 as shown in FIG. 3.

Figure 10:
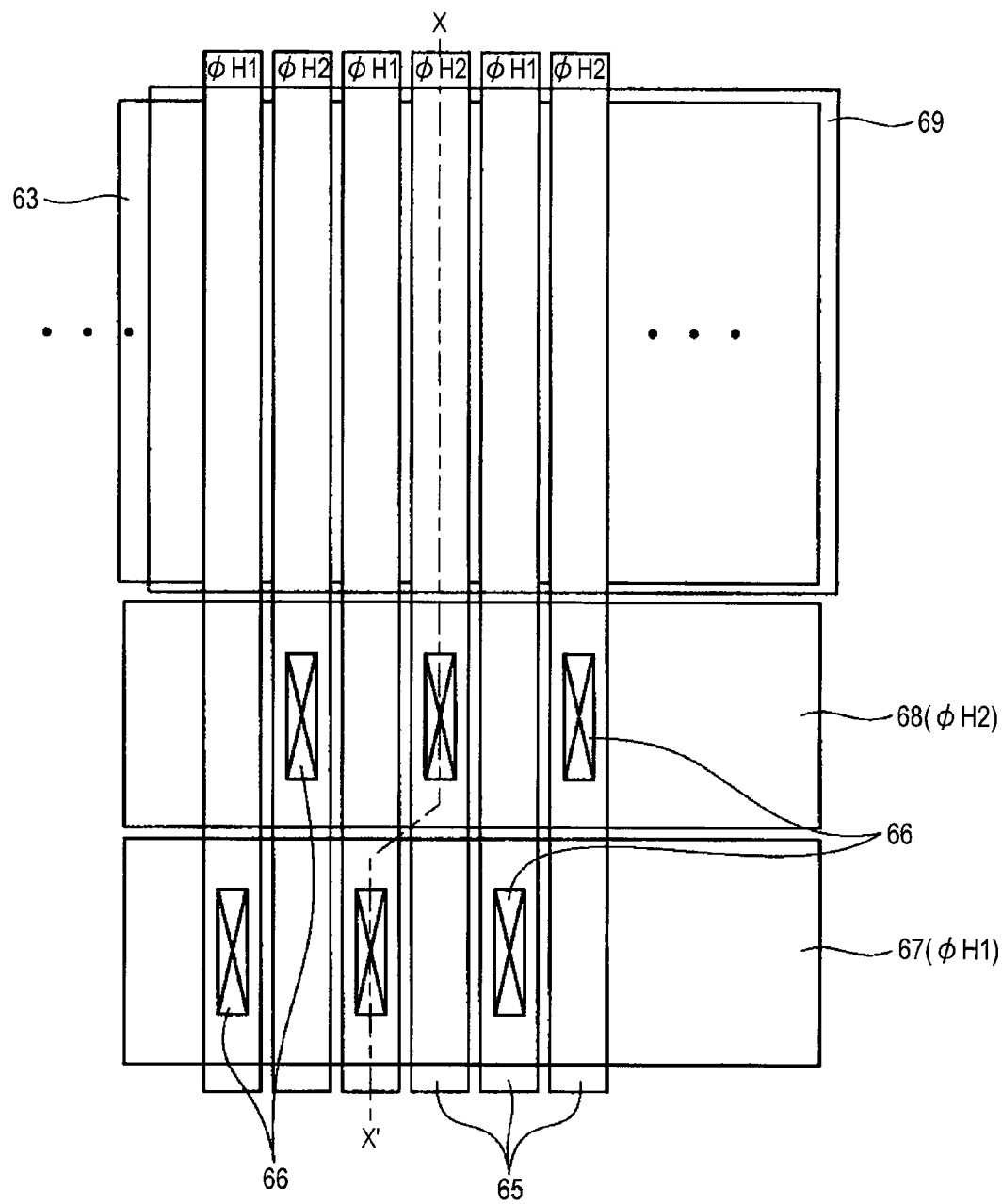
FIG. 10 is an enlarged plan view showing a horizontal transfer register of a CCD solid state imaging device, in which a horizontal transfer electrode is formed of a polycrystalline silicon layer of a single layer, and its neighborhood.
Figure 11:
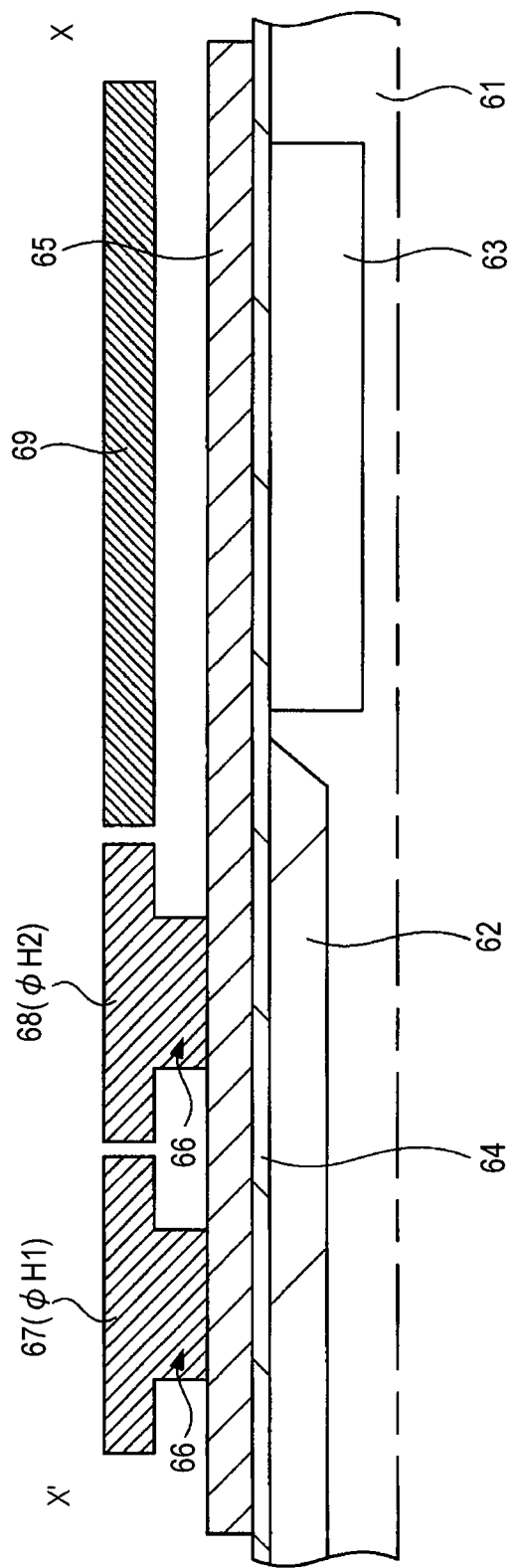
FIG. 11 is a cross-sectional view taken along the line X-X' of FIG. 10.

In this case, it is not necessary to provide a region only for connection between a horizontal transfer electrode and a bus line unlike the configuration shown in FIGS. 10 and 11 in which a bus line and a contact section are disposed outside the horizontal transfer register.

In addition, a light shielding layer 18 is formed so as to cover the horizontal transfer electrode 14 of a portion equivalent to a gap between the bus lines 16 and 17 or a portion equivalent to the outside of the bus lines 16 and 17.

For example, tungsten or aluminum may be used for the light shielding layer 18.

Although a light shielding layer is formed of a metal layer of the same layer as a bus line in the configuration shown in FIGS. 10 and 11, there is a slit-like gap between the bus lines 16 and 17 in the present embodiment. Accordingly, in the present embodiment, the light shielding layer 18 is formed of a metal layer positioned below the bus lines 16 and 17 in order to fill the slit-like gap.

By forming the light shielding layer 18 as described above, it is possible to prevent light from being incident on the horizontal transfer register 4 to thereby change a signal charge.

Particularly in the solid state imaging device according to the present embodiment, in the contact section 15, a barrier metal layer 21 is formed at an interface between the metal layer of the bus lines 16 and 17 and the polycrystalline silicon layer of the horizontal transfer electrode 14 and its neighborhood, as shown in FIG. 3.

For example, titanium nitride (TiN), titanium tungsten (TiW), tungsten nitride (WN), or tantalum nitride (TaN) may be used for the barrier metal layer 21.

Work functions of these materials are sizes between the work function of the metal wiring layer of the bus lines 16 and 17 and the work function of the polycrystalline silicon layer of the horizontal transfer electrode 14.

In addition to these materials, any material having a work function of the size between the work function of the metal wiring layer of the bus lines 16 and 17 and the work function of the polycrystalline silicon layer of the horizontal transfer electrode 14 may also be used similarly.

The barrier metal layer 21 and the bus lines 16 and 17 of the solid state imaging device according to the present embodiment may be formed as follows, for example.

First, similarly to the case of the known configuration, the polycrystalline silicon layer of the horizontal transfer electrode 14 is patterned to form the horizontal transfer electrode 14.

Then, the horizontal transfer electrode 14 is covered by an insulating layer.

Then, the insulating layer in a portion used as the contact section 15 is removed by etching. As a result, an opening which reaches the horizontal transfer electrode 14 is formed in the insulating layer.

Then, the barrier metal layer 21 is formed of a material (for example, TiN, TiW, WN, or TaN) by sputtering or the like. As a result, in a lower portion of the opening, the barrier metal layer 21 is formed adjacent to the horizontal transfer electrode 14.

Then, the inside of the opening is filled to form a complete metal wiring layer serving as the bus lines 16 and 17.

Then, the metal wiring layer is patterned to form the bus lines 16 and 17. In this patterning, an unnecessary barrier metal layer on the insulating layer, which is positioned outside the bus lines 16 and 17, is also removed.

In this way, in the contact section 15, the barrier metal layer 21 can be formed between the horizontal transfer electrode 14 and the bus lines 16 and 17.

In addition, the barrier metal layer 21 may also be formed using a method other than the method described above.

In the above-described configuration of the CCD solid state imaging device 1 according to the present embodiment, in the contact section 15, the barrier metal layer 21 is formed at the interface between the metal layer of the bus lines 16 and 17 and the polycrystalline silicon layer of the horizontal transfer electrode 14 and its neighborhood. Moreover, the work function of a material of the barrier metal layer 21 is a size between the work function of the metal wiring layer of the bus lines 16 and 17 and the work function of the polycrystalline silicon layer of the horizontal transfer electrode 14.

Accordingly, the occurrence of potential shift in the horizontal transfer register 4 can be suppressed. As a result, since it is possible to prevent transfer deterioration of a signal charge in the horizontal transfer register 4, it becomes possible to transfer a signal charge satisfactorily. That is, the quality of an image obtained in the CCD solid state imaging device 1 can be improved.

In addition, since the bus lines 16 and 17 and the contact section 15 are formed above the horizontal transfer register 4 and at the approximately same plane position as the horizontal register 4, it is not necessary to provide a region only for connection between a horizontal transfer electrode and a bus line.

Accordingly, since the area of the CCD solid state imaging device 1 can be reduced, it becomes possible to reduce the chip size of the CCD solid state imaging device 1. As a result, it is possible to improve the yield. That is, it is possible to increase the number of chips of the CCD solid state imaging devices 1 which can be acquired from one wafer.

In addition, since it is not necessary to extend the horizontal transfer electrode 14 to the outside of the horizontal transfer register 4, the load capacitance of the horizontal transfer electrode 14 can be reduced. As a result, it is possible to increase the transfer speed of a signal charge in the horizontal transfer register 4 or to reduce the power consumption of the CCD solid state imaging device 1.

Moreover, in the CCD solid state imaging device 1 according to the present embodiment, the bus lines 16 and 17 also serve as a light shielding layer for the horizontal transfer register 4, and the light shielding layer 18 is disposed in a gap between the bus lines 16 and 17. In this case, the horizontal transfer register 4 can be completely covered by the bus lines 16 and 17 and the light shielding layer 18. As a result, it is possible to prevent light from being incident on the horizontal transfer register 4 thereby to cause aliasing.

In addition, existing processes may be used except the process of forming the barrier metal layer 21. Therefore, by adding only the process of forming the barrier metal layer 21, the CCD solid state imaging device can be manufactured without adding other processes.

In the first embodiment described above, as shown in FIG. 2, the light shielding layer 18 is formed in a strip shape parallel to the slit-like gap between the bus lines 16 and 17.

On the other hand, for example, it is also possible to provide an opening around the contact section 15 and to form the light shielding layer 18 on the entire horizontal transfer electrode 14 excluding the contact section 15 and its neighborhood. In this case, for example, the size of the opening of the light shielding layer is set to be larger by about several micrometers than the size of the contact section 15.

2. Second Embodiment of a Solid State Imaging Device

Figure 4:
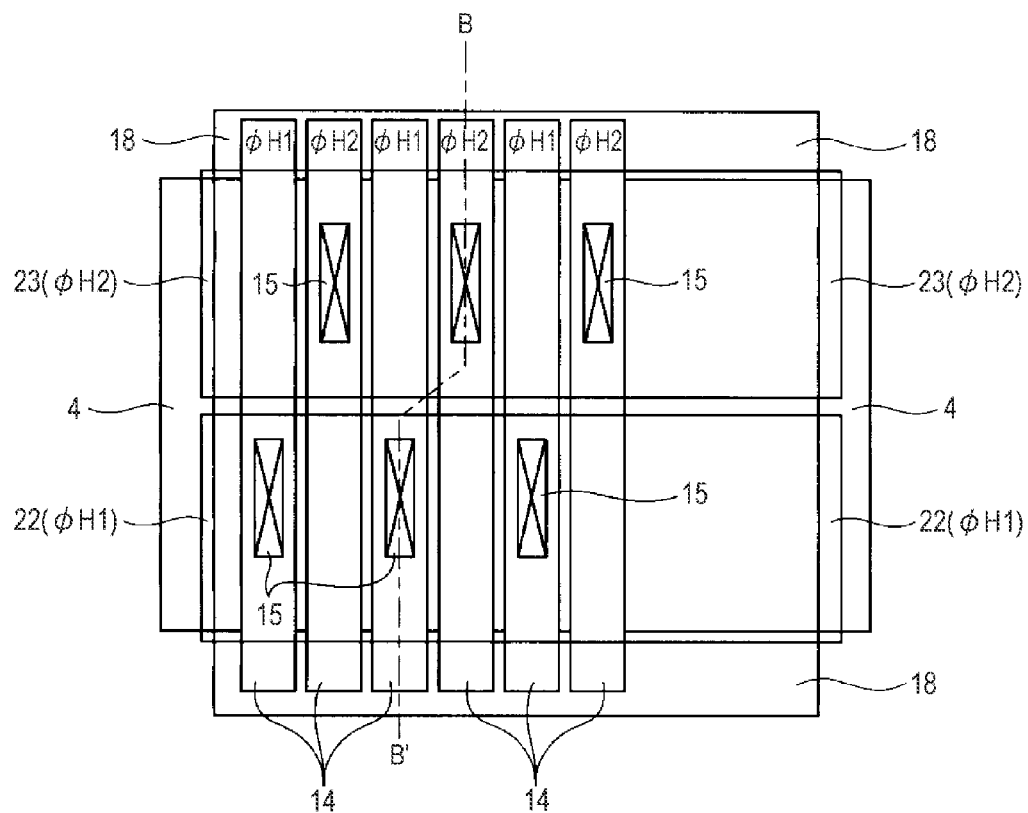
FIG. 4 is an enlarged plan view showing a horizontal transfer register and its neighborhood in a solid state imaging device according to a second embodiment of the present invention.

FIG. 4 is a view (enlarged plan view of main sections) showing the schematic configuration of a solid state imaging device according to a second embodiment of the present invention. In addition, FIG. 5 is a cross-sectional view taken along the line B-B' of FIG. 4.

In addition, the schematic plan view is the same as that in the first embodiment shown in FIG. 1.

The CCD solid state imaging device is also applied as the solid state imaging device according to the second embodiment of the present invention.

Figure 5:
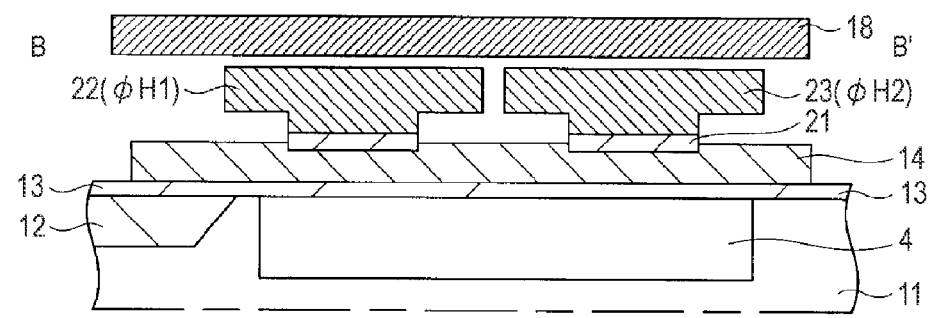
FIG. 5 is a cross-sectional view taken along the line B-B' of FIG. 4.

As shown in FIGS. 4 and 5, a bus line 22 for supplying a horizontal transfer pulse φH1 of a first phase is electrically connected to a horizontal transfer electrode 14, to which the horizontal transfer pulse φH1 of the first phase is applied, by a contact section 15. A bus line 23 for supplying a horizontal transfer pulse φH2 of a second phase is electrically connected to the horizontal transfer electrode 14, to which the horizontal transfer pulse φH2 of the second phase is applied, by the contact section 15.

The bus lines 22 and 23 are formed of a metal wiring layer and formed to extend in a horizontal direction H so as to be parallel to the horizontal transfer register 4.

As a material of the metal wiring layer which forms the bus lines 22 and 23, aluminum, tungsten, or copper may be used, for example. In addition, other metal elements or an alloy may also be used for the bus lines 22 and 23.

In addition, the bus lines 22 and 23 and the contact section 15 are at the approximately same plane position as the horizontal transfer register 4 as shown in FIG. 4 and are disposed above the horizontal transfer register 4 as shown in FIG. 5.

In this case, it is not necessary to provide a region only for connection between a horizontal transfer electrode and a bus line unlike the configuration shown in FIGS. 10 and 11 in which a bus line and a contact section are disposed outside the horizontal transfer register.

Moreover, in the present embodiment, the bus lines 22 and 23 are formed of the same metal layer as the metal layer for the vertical transfer register 3 shown in FIG. 1. As a metal layer for the vertical transfer register 3, a light shielding layer which covers the vertical transfer register 3 or a vertical transfer electrode, a wiring layer for supplying a driving pulse to the vertical transfer electrode, and the like may be mentioned.

Therefore, by forming a metal layer on the entire surface and patterning the metal layer, the bus lines 22 and 23 for the horizontal transfer register 4 and a metal layer (for example, a light shielding layer or a wiring layer) for the vertical transfer register 3 can be simultaneously formed.

In addition, the light shielding layer 18 for the horizontal transfer register 4 is formed above the layer of the bus lines 22 and 23 and is also formed on the entire surfaces of the horizontal transfer register 4 and horizontal transfer electrode 14.

In the solid state imaging device according to the present embodiment, in the contact section 15, a barrier metal layer 21 is formed at an interface between the metal layer of the bus lines 22 and 23 and the polycrystalline silicon layer of the horizontal transfer electrode 14 and its neighborhood.

For example, titanium nitride (TiN), titanium tungsten (TiW), tungsten nitride (WN), or tantalum nitride (TaN) may be used for the barrier metal layer 21. Work functions of these materials are sizes between the work function of the metal wiring layer of the bus lines 22 and 23 and the work function of the polycrystalline silicon layer of the horizontal transfer electrode 14.

In addition to these materials, any material having a work function of the size between the work function of the metal wiring layer of the bus lines 22 and 23 and the work function of the polycrystalline silicon layer of the horizontal transfer electrode 14 may also be used similarly.

The other configuration is the same as that of the CCD solid state imaging device 1 according to the first embodiment. Accordingly, the same reference numerals are given, and the explanation will not be repeated.

In the above-described configuration of the CCD solid state imaging device according to the present embodiment, in the contact section 15, the barrier metal layer 21 is formed at the interface between the metal layer of the bus lines 22 and 23 and the polycrystalline silicon layer of the horizontal transfer electrode 14 and its neighborhood. Moreover, the work function of a material of the barrier metal layer 21 is a size between the work function of the metal wiring layer of the bus lines 22 and 23 and the work function of the polycrystalline silicon layer of the horizontal transfer electrode 14.

Accordingly, similar to the first embodiment, the occurrence of potential shift in the horizontal transfer register 4 can be suppressed. As a result, since it is possible to prevent transfer deterioration of a signal charge in the horizontal transfer register 4, it becomes possible to transfer a signal charge satisfactorily. That is, the quality of an image obtained in the CCD solid state imaging device can be improved.

In addition, since the bus lines 22 and 23 and the contact section 15 are formed above the horizontal transfer register 4 and at the approximately same plane position as the horizontal register 4, it is not necessary to provide a region only for connection between a horizontal transfer electrode and a bus line.

Accordingly, similar to the first embodiment, it is possible to reduce the chip size of the CCD solid state imaging device. As a result, it is possible to improve the yield. That is, it is possible to increase the number of chips of the CCD solid state imaging devices 1 which can be acquired from one wafer. In addition, since the load capacitance of the horizontal transfer electrode 14 can be reduced, it is possible to increase the transfer speed of a signal charge in the horizontal transfer register 4 or to reduce the power consumption of the CCD solid state imaging device.

3. Third Embodiment of a Solid State Imaging Device

Figure 6:
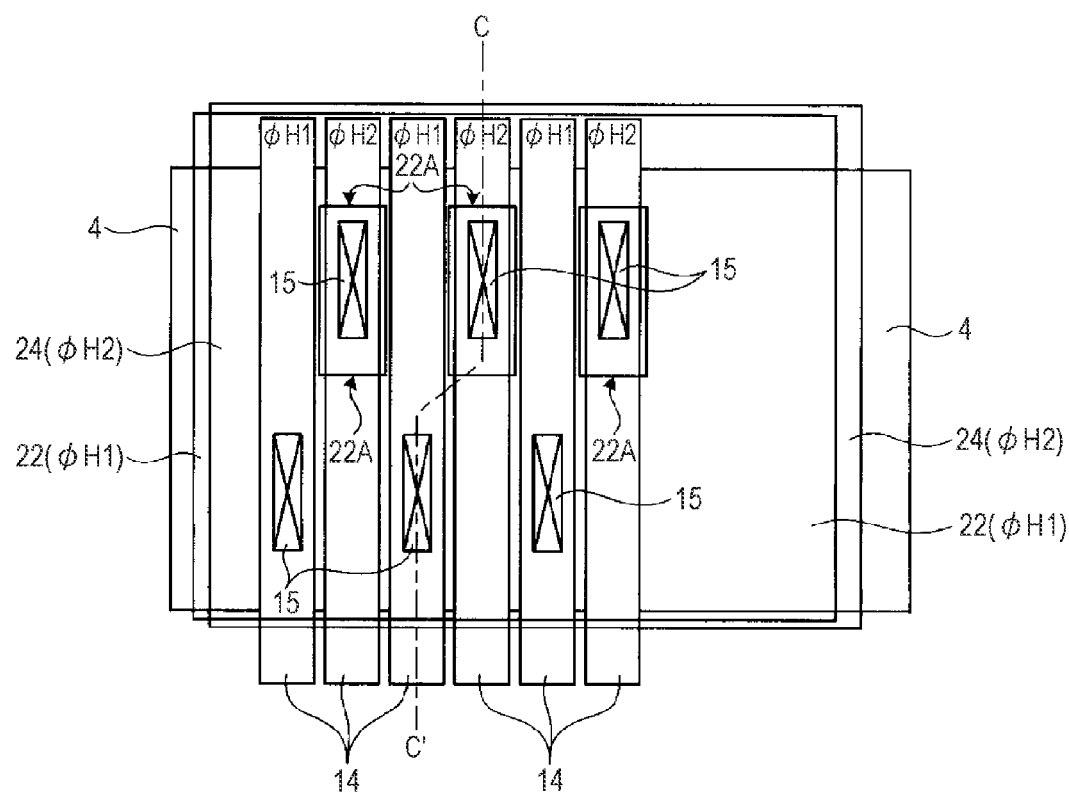
FIG. 6 is an enlarged plan view showing a horizontal transfer register and its neighborhood in a solid state imaging device according to a third embodiment of the present invention.

FIG. 6 is a view (enlarged plan view of main sections) showing the schematic configuration of a solid state imaging device according to a third embodiment of the present invention. In addition, FIG. 7 is a cross-sectional view taken along the line C-C' of FIG. 6.

In addition, the schematic plan view is the same as that in the first embodiment shown in FIG. 1.

The CCD solid state imaging device is also applied as the solid state imaging device according to the third embodiment of the present invention.

Figure 7:
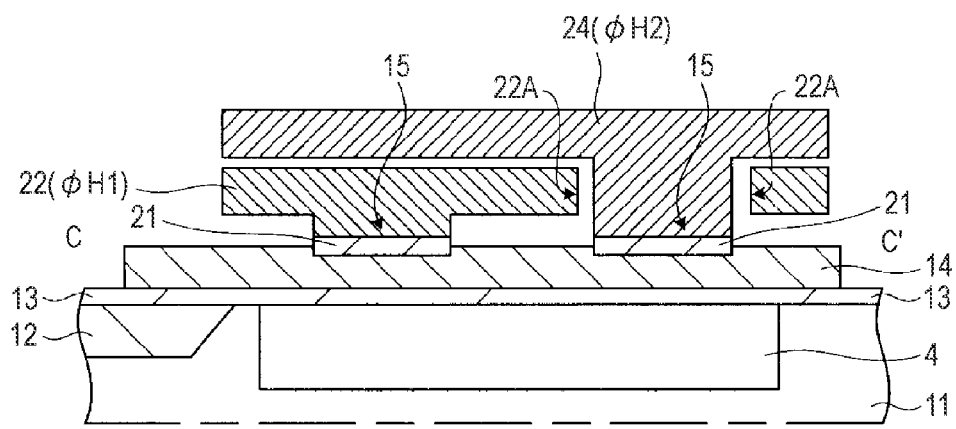
FIG. 7 is a cross-sectional view taken along the line C-C' of FIG. 6.

As shown in FIGS. 6 and 7, a bus line 22 for supplying a horizontal transfer pulse $\phi$H1 of a first phase is electrically connected to a horizontal transfer electrode 14, to which the horizontal transfer pulse $\phi$H1 of the first phase is applied, by a contact section 15. A bus line 24 for supplying a horizontal transfer pulse $\phi$H2 of a second phase is electrically connected to the horizontal transfer electrode 14, to which the horizontal transfer pulse $\phi$H2 of the second phase is applied, by the contact section 15.

The bus lines 22 and 24 are formed of a metal wiring layer and formed to extend in a horizontal direction H so as to be parallel to the horizontal transfer register 4.

As a material of the metal wiring layer which forms the bus lines 22 and 24, aluminum, tungsten, or copper may be used, for example. In addition, other metal elements or an alloy may also be used for the bus lines 22 and 24.

In addition, the bus lines 22 and 24 and the contact section 15 are at the approximately same plane position as the horizontal transfer register 4 as shown in FIG. 6 and are disposed above the horizontal transfer register 4 as shown in FIG. 7.

In this case, it is not necessary to provide a region only for connection between a horizontal transfer electrode and a bus line unlike the configuration shown in FIGS. 10 and 11 in which a bus line and a contact section are disposed outside the horizontal transfer register.

Moreover, in the present embodiment, the bus line 22 for supplying the horizontal transfer pulse $\phi$H1 of the first phase is formed of the same metal layer as the metal layer for the vertical transfer register 3 shown in FIG. 1, similar to the second embodiment. As a metal layer for the vertical transfer register 3, a light shielding layer which covers the vertical transfer register 3 or a vertical transfer electrode, a wiring layer for supplying a driving pulse to the vertical transfer electrode, and the like may be mentioned.

Therefore, by forming a metal layer on the entire surface and patterning the metal layer, the bus line 22 for supplying the horizontal transfer pulse $\phi$H1 of the first phase for the horizontal transfer register 4 and a metal layer (for example, a light shielding layer or a wiring layer) for the vertical transfer register 3 can be simultaneously formed.

However, the plane pattern of the bus line 22 for supplying the horizontal transfer pulse $\phi$H1 of the first phase in the present embodiment is different from that in the second embodiment. Specifically, an opening 22A is formed in the bus line 22 so that the contact section 15 between the horizontal transfer electrode 14 and the bus line 24 for supplying the horizontal transfer pulse $\phi$H2 of the second phase and its neighborhood are removed. In addition, the bus line 22 is formed above the horizontal transfer register 4 in a portion other than the opening 22A.

The size of the opening 22A is set to be larger by about several micrometers than the size of the contact section 15 between the bus line 24 and the horizontal transfer electrode 14, for example.

On the other hand, the bus line 24 for supplying the horizontal transfer pulse $\phi$H2 of the second phase is not the same metal layer as the metal layer for the vertical transfer register 3 but is a separate metal layer from the metal layer for the vertical transfer register 3, unlike the bus lines 16 and 17 in the first embodiment. The bus line 24 is formed above the bus line 22 for supplying the horizontal transfer pulse $\phi$H1 of the first phase and is also formed on the entire surface of the horizontal transfer register 4.

Moreover, in the present embodiment, the two bus lines 22 and 24 serve as the light shielding layer for the horizontal transfer register 4. Particularly in the upper bus line 24, there is no gap on the horizontal transfer register 4. Accordingly, even if a light shielding layer is not additionally provided, the horizontal transfer register 4 can be sufficiently shaded by the two bus lines 22 and 24.

In the solid state imaging device according to the present embodiment, in the contact section 15, a barrier metal layer 21 is formed at an interface between the metal layer of the bus lines 22 and 24 and the polycrystalline silicon layer of the horizontal transfer electrode 14 and its neighborhood.

For example, titanium nitride (TiN), titanium tungsten (TiW), tungsten nitride (WN), or tantalum nitride (TaN) may be used for the barrier metal layer 21. Work functions of these materials are sizes between the work function of the metal wiring layer of the bus lines 22 and 24 and the work function of the polycrystalline silicon layer of the horizontal transfer electrode 14.

In addition to these materials, any material having a work function of the size between the work function of the metal wiring layer of the bus lines 22 and 24 and the work function of the polycrystalline silicon layer of the horizontal transfer electrode 14 may also be used similarly.

The other configuration is the same as that of the CCD solid state imaging device 1 according to the first embodiment. Accordingly, the same reference numerals are given, and the explanation will not be repeated.

In the above-described configuration of the CCD solid state imaging device according to the present embodiment, in the contact section 15, the barrier metal layer 21 is formed at the interface between the metal layer of the bus lines 22 and 24 and the polycrystalline silicon layer of the horizontal transfer electrode 14 and the neighborhood. Moreover, the work function of a material of the barrier metal layer 21 is a size between the work function of the metal wiring layer of the bus lines 22 and 24 and the work function of the polycrystalline silicon layer of the horizontal transfer electrode 14.

Accordingly, similar to the first embodiment, the occurrence of potential shift in the horizontal transfer register 4 can be suppressed. As a result, since it is possible to prevent transfer deterioration of a signal charge in the horizontal transfer register 4, it becomes possible to transfer a signal charge satisfactorily. That is, the quality of an image obtained in the CCD solid state imaging device can be improved.

In addition, since the bus lines 22 and 24 and the contact section 15 are formed above the horizontal transfer register 4 and at the approximately same plane position as the horizontal register 4, it is not necessary to provide a region only for connection between a horizontal transfer electrode and a bus line.

Accordingly, similar to the first embodiment, it is possible to reduce the chip size of the CCD solid state imaging device. As a result, it is possible to improve the yield. That is, it is possible to increase the number of chips of the CCD solid state imaging devices 1 which can be acquired from one wafer. In addition, since the load capacitance of the horizontal transfer electrode 14 can be reduced, it is possible to increase the transfer speed of a signal charge in the horizontal transfer register 4 or to reduce the power consumption of the CCD solid state imaging device.

Moreover, in the present embodiment, the bus lines 22 and 24 also serve as a light shielding layer for the horizontal transfer register 4. By the bus lines 22 and 24, the horizontal transfer register 4 can be completely covered. As a result, it is possible to prevent light from being incident on the horizontal transfer register 4 to thereby cause aliasing. In addition, it is not necessary to provide a light shielding layer separately from the bus lines 22 and 24.

4. Fourth Embodiment of a Solid State Imaging Device

Although the first to third embodiments are area sensors in which pixels formed of light receiving sections are arrayed in a matrix, the present invention may also be applied to a line sensor in which pixels formed of light receiving sections are arrayed linearly. This case is shown as a solid state imaging device according to a fourth embodiment of the present invention.

Figure 8:
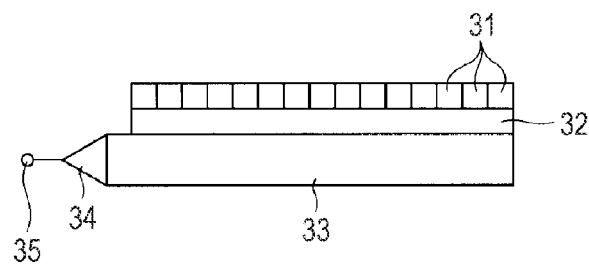
FIG. 8 is a view (plan view) showing the schematic configuration of a solid state imaging device according to a fourth embodiment of the present invention.

FIG. 8 is a schematic plan view showing the solid state imaging device according to the fourth embodiment of the present invention.

The CCD solid state imaging device is also applied as the solid state imaging device according to the fourth embodiment of the present invention.

As shown in FIG. 8, in this CCD solid state imaging device, a plurality of light receiving sections 31 which form pixels are arrayed linearly. For example, the light receiving section 31 is formed of a photodiode.

A transfer register 33 extending left and right is disposed below each light receiving section 31, and a read gate 32 is provided between the light receiving section 31 and the transfer register 33.

The read gate 32 is formed integrally with all light receiving sections 31. Accordingly, by driving the read gate 32, signal charges accumulated in the light receiving sections 31 can be simultaneously read to the transfer register 33.

An output amplifier 34 and an output terminal 35 are connected to the left end of the transfer register 33.

In this CCD solid state imaging device, a signal charge read from each light receiving section 31 is read to a corresponding portion of the transfer register 33 by driving of the read gate 32. Then, the signal charge is transferred in the transfer register 33 and is then converted into a voltage signal by the output amplifier 34 and output from the output terminal 35 sequentially. In addition, a charge transfer section of the CCD structure is formed of the transfer register 33 and a transfer electrode (not shown) formed on the transfer register 33.

Moreover, although not shown in detail, the transfer electrode for the transfer register 33 and the bus line in the present embodiment may be formed like the horizontal transfer electrode 14 and the bus lines 16, 17, 22, 23, and 24 in the first to third embodiments. That is, it is also possible to dispose the transfer electrode, the bus line, and the contact section above the transfer register 33 and to form the barrier metal layer at the interface between the metal layer of the bus line and the polycrystalline silicon layer of the transfer electrode and its neighborhood in the contact section.

Accordingly, the occurrence of potential shift in the transfer register 33 can be suppressed. As a result, since it is possible to prevent transfer deterioration of a signal charge in the transfer register 33, it becomes possible to transfer a signal charge satisfactorily. That is, the quality of an image obtained in the CCD solid state imaging device can be improved.

In addition, it is possible to reduce the chip size of the CCD solid state imaging device. As a result, it is possible to improve the yield. That is, it is possible to increase the number of chips of the CCD solid state imaging devices 1 which can be acquired from one wafer. In addition, since the load capacitance of the transfer electrode can be reduced, it is possible to increase the transfer speed of a signal charge in the transfer register 33 or to reduce the power consumption of the CCD solid state imaging device.

In addition, although the configuration in which the light receiving sections 31 are disposed in a line and one transfer register 33 is provided is shown in FIG. 8, it is also possible to adopt a configuration in which one transfer register is provided for every line of light receiving sections of three lines like a color line sensor.

5. Modifications

In the first to third embodiments described above, only one horizontal transfer register 4 is formed. However, the present invention may be similarly applied to a configuration in which a plurality of horizontal transfer registers are formed.

For example, it is also possible to provide two horizontal transfer registers as disclosed in JP-A-2004-312664 or JP-A-2007-165650.

In the first to third embodiments, a configuration in which a horizontal transfer section is driven in two phases is adopted.

However, the present invention may also be applied to the cases where the horizontal transfer section or the charge transfer section of the line sensor is driven in three phases.

When performing 3-phase driving by modifying the first and second embodiments, it is preferable simply to increase the number of bus lines to 3.

When performing 3-phase driving by modifying the third embodiment, it is preferable to form a bus line of the first phase and a bus line of the third phase on the same wiring layer.

In the first to third embodiments, of two bus lines, the bus lines 17, 23, and 24 for supplying the driving pulse φH2 of the second phase are disposed closer to the vertical transfer section. On the other hand, the bus lines 16 and 22 for supplying the driving pulse φH1 of the first phase may be disposed closer to the vertical transfer section by reversing the arrangement of two bus lines.

Moreover, in the third embodiment, a bus line for supplying the driving pulse φH2 of the second phase may be positioned in a lower layer by reversing a lower bus line with an opening and an upper bus line.

In the first embodiment, a polycrystalline silicon layer is formed as the transfer electrode 14 using a silicon substrate or a silicon layer as the semiconductor base 11.

In the present invention, materials of a semiconductor base in which a light receiving section or a transfer register is formed and a semiconductor layer of a transfer electrode are not limited to silicon, and other semiconductor materials may also be used.

In each of the embodiments described above, the present invention was applied to the CCD solid state imaging device in which a charge transfer section has a CCD structure. However, the present invention may be similarly applied to a solid state imaging device with a charge transfer section other than the CCD structure.

6. Embodiment of an Imaging Apparatus

Next, an imaging apparatus according to another embodiment of the present invention will be described.

Figure 9:
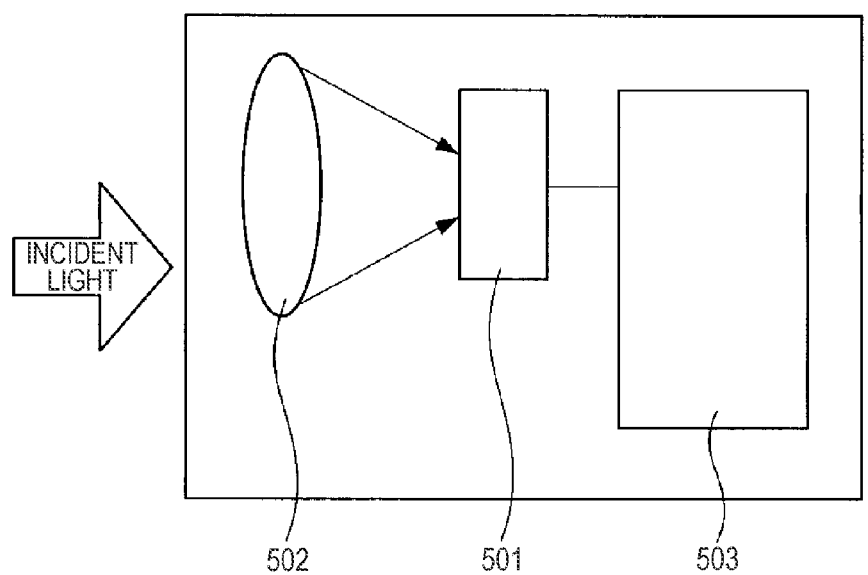
FIG. 9 is a view (block diagram) showing the schematic configuration of an imaging apparatus according to another embodiment of the present invention.

FIG. 9 is a view (block diagram) showing the schematic configuration of the imaging apparatus according to the embodiment of the present invention.

Examples of the imaging apparatus include a video camera, a digital still camera, and a camera of a mobile phone.

As shown in FIG. 9, an imaging apparatus 500 includes an imaging unit 501 having a solid state imaging device (not shown). An image forming optical system 502 which forms an image by condensing incident light is provided before the imaging unit 501. In addition, a signal processor 503 including a driving circuit for driving the imaging unit 501, a signal processing circuit for image processing of a signal photoelectrically converted by the solid state imaging device, and the like is connected in a subsequent stage of the imaging unit 501. In addition, an image signal processed by the signal processor 503 may be stored in an image storage unit (not shown).

In such an imaging apparatus 500, the solid state imaging device according to each of the embodiments described above may be used as a solid state imaging device.

In the imaging apparatus 500 according to the present embodiment, the solid state imaging device according to each of the embodiments described above, that is, a solid state imaging device capable of reducing the chip size and of performing the transfer of a signal charge satisfactorily is used. This is advantageous in that the size of the imaging apparatus 500 can be reduced and the quality of an image obtained in the imaging apparatus 500 can be improved. In addition, since it is possible to increase the speed in charge transfer of the solid state imaging device or to reduce the power consumption of the solid state imaging device, it becomes possible to increase the operation speed of the imaging apparatus 500 or to reduce the power consumption of the imaging apparatus 500.

In addition, the imaging apparatus according to the embodiment of the present invention is not limited to the configuration shown in FIG. 9, and the present invention may be applied to any kind of imaging apparatus which uses a solid state imaging device.

For example, the solid state imaging device may be formed as one chip or may be formed as a module type device in which an imaging unit and a signal processor or an optical system are collectively packaged and which has an imaging function.

The imaging apparatus according to the embodiment of the present invention may be applied to various kinds of imaging apparatuses, such as a camera or a portable apparatus having an imaging function, for example. In addition, in a broader sense, the meaning of "imaging" also includes detection of a fingerprint and the like.

The present invention is not limited to the embodiments described above, and various other configurations may be applied within the scope without departing from the subject matter of the present invention.

The present application contains subject matter related to that disclosed in Japanese Priority Patent Application JP 2009-114804 filed in the Japan Patent Office on May 11, 2009, the entire contents of which is hereby incorporated by reference.

What is claimed is:

1. A solid state imaging device comprising:
   a light receiving section operable to perform photoelectric conversion;
   a transfer register formed in a semiconductor base;
   a transfer electrode formed of a semiconductor layer on the transfer register;
   a charge transfer section formed of the transfer register and the transfer electrode and operable to transfer a signal charge accumulated in the light receiving section;
   a bus line electrically connected to a portion of the transfer electrode on the transfer register to supply a driving pulse to the transfer electrode and formed of a metal layer; and
   a barrier metal layer formed at an interface between the transfer electrode and the bus line in a contact section that connects the transfer electrode and the bus line and has a work function of the size between a work function of the semiconductor layer of the transfer electrode and a work function of the metal layer of the bus line, the barrier metal layer spacing the transfer electrode from the bus line in the contact section.

2. The solid state imaging device according to claim 1, wherein:
   the plurality of light receiving sections are arrayed in a matrix,
   every column of the light receiving section includes a vertical transfer section, the vertical transfer section having a horizontal transfer section connected to one end of the vertical transfer section, and
   the charge transfer section is the horizontal transfer section and the transfer electrode is a horizontal transfer electrode.

3. The solid state imaging device according to claim 1, wherein the bus line also serves as a light shielding layer which covers the transfer register.

4. The solid state imaging device according to claim 1, wherein the semiconductor base is formed of silicon, and the transfer electrode is formed of a polycrystalline silicon layer.

5. The solid state imaging device according to claim 1, wherein the barrier metal layer is formed of a material of TiN, TiW, WN, or TaN.

6. The solid state imaging device according to claim 1, wherein the barrier metal layer is partially embedded in the transfer electrode.

7. The solid state imaging device according to claim 1, wherein the transfer electrode spaces the barrier metal layer from the gate insulating layer.

* * * * *